(12) United States Patent
Lowe

(10) Patent No.: US 11,728,395 B2
(45) Date of Patent: Aug. 15, 2023

(54) INTEGRATED ASSEMBLIES AND METHODS OF FORMING INTEGRATED ASSEMBLIES

(71) Applicant: Micron Technology, Inc., Boise, ID (US)

(72) Inventor: Aaron Michael Lowe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/867,579

(22) Filed: Jul. 18, 2022

(65) Prior Publication Data
US 2022/0352324 A1 Nov. 3, 2022

Related U.S. Application Data

(62) Division of application No. 16/940,852, filed on Jul. 28, 2020, now Pat. No. 11,527,623.

(51) Int. Cl.
*H01L 29/40* (2006.01)
*H01L 21/28* (2006.01)
(Continued)

(52) U.S. Cl.
CPC .......... *H01L 29/40111* (2019.08); *G11C 5/06* (2013.01); *G11C 11/221* (2013.01); *G11C 11/2257* (2013.01); *H01L 27/0688* (2013.01); *H01L 29/7827* (2013.01); *H10B 12/30* (2023.02); *H10B 53/00* (2023.02)

(58) Field of Classification Search
CPC ........... H01L 29/40111; H01L 27/0688; H01L 27/10805; H01L 27/11502; H01L 29/7827; G11C 5/06; G11C 11/221; G11C 11/2257; H10B 12/30; H10B 53/00; H10B 12/05; H10B 53/30
See application file for complete search history.

(56) References Cited

U.S. PATENT DOCUMENTS 8,189,376 B2 * 5/2012 Koldiaev .............. H01L 27/108
365/174
10,083,877 B1 * 9/2018 Sano ........................ H01L 45/08
(Continued)

OTHER PUBLICATIONS

Chen et al., "TiN Metal Gate Electrode Thickness Effect on BTI and Dielectric Breakdown in HfSiON-Based MOSFETs", IEEE Transactions on Electronc Devices vol. 58, No. 11, Nov. 2011, United States, pp. 3736-3742.
(Continued)

*Primary Examiner* — S M Sohel Imtiaz
(74) *Attorney, Agent, or Firm* — Wells St. John P.S.

(57) ABSTRACT

Some embodiments include an integrated transistor having an active region comprising semiconductor material. The active region includes a first source/drain region, a second source/drain region and a channel region between the first and second source/drain regions. A conductive gating structure is operatively proximate the channel region and comprises molybdenum. The integrated transistor may be incorporated into integrated memory, such as, for example, DRAM, FeFET memory, etc. Some embodiments include methods of forming integrated assemblies and devices, such as, for example, integrated transistors, integrated memory, etc.

20 Claims, 10 Drawing Sheets

(51) Int. Cl.
*G11C 11/22* (2006.01)
*G11C 5/06* (2006.01)
*H01L 29/78* (2006.01)
*H01L 27/06* (2006.01)
*H10B 12/00* (2023.01)
*H10B 53/00* (2023.01)

(56) References Cited

U.S. PATENT DOCUMENTS

| | | | |
|---|---|---|---|
| 2004/0262635 A1* | 12/2004 | Lee | H01L 29/792 |
| | | | 257/199 |
| 2008/0121962 A1* | 5/2008 | Forbes | H01L 21/28194 |
| | | | 257/310 |
| 2015/0200308 A1* | 7/2015 | Karda | H01L 45/141 |
| | | | 257/329 |
| 2016/0141336 A1* | 5/2016 | Karda | H01L 29/7827 |
| | | | 257/29 |
| 2019/0206861 A1* | 7/2019 | Beigel | G11C 29/42 |
| 2019/0393223 A1* | 12/2019 | Sharma | H01L 29/42392 |
| 2021/0265488 A1* | 8/2021 | Yeh | H01L 21/2236 |
| 2021/0319819 A1* | 10/2021 | Sanjeevarao | G11C 11/1653 |
| 2021/0384307 A1* | 12/2021 | Ma | H01L 29/78696 |

OTHER PUBLICATIONS

Lifshitz et al., "Comparative Study of the Low Pressure Chemical Vapor Deposition Processes of W and Mo", Solid-State Science and Technology vol. 135 No. 7, Jul. 1988, United States, pp. 1832-1836.

* cited by examiner

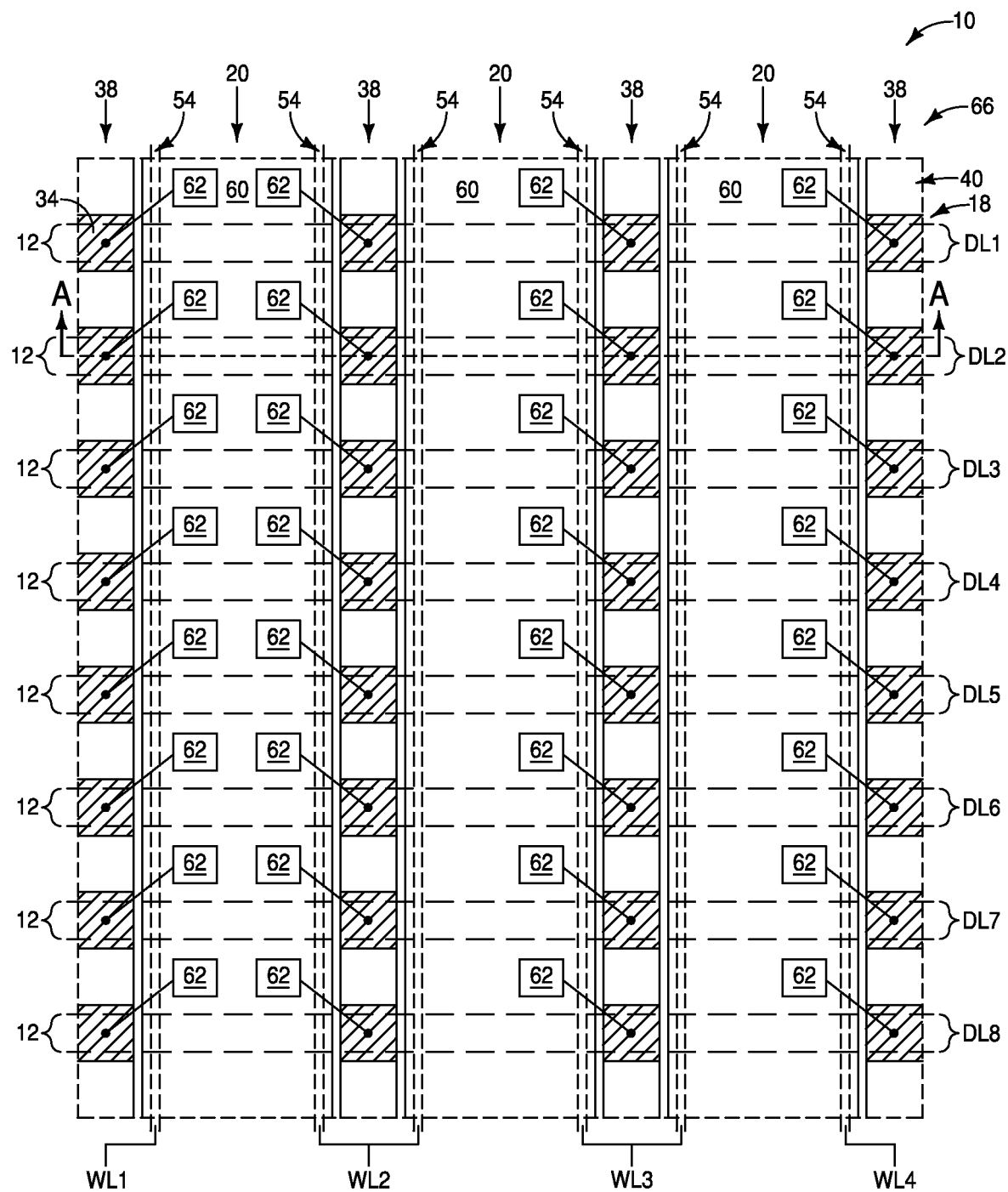
FIG. 6A
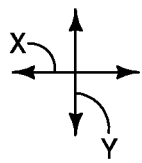

INTEGRATED ASSEMBLIES AND METHODS OF FORMING INTEGRATED ASSEMBLIES

RELATED PATENT DATA

This patent resulted from a divisional of U.S. patent application Ser. No. 16/940,852, filed Jul. 28, 2020, which is hereby incorporated by reference herein.

TECHNICAL FIELD

Integrated assemblies and devices (e.g., integrated transistors, integrated memory). Methods of forming integrated assemblies.

BACKGROUND

Transistors are utilized in a variety of semiconductor devices. Field effect transistors (FETs) include a channel region between a pair of source/drain regions, and include one or more gates configured to electrically connect the source/drain regions to one another through the channel region.

Vertical FETs (VFETs) have channel regions that are generally perpendicular to a primary surface of a substrate on which the transistors are formed.

The transistors may be incorporated into memory arrays, and may be utilized as access devices for memory cells of the memory arrays.

It is desired to develop new methods for forming integrated transistors and integrated memory. It is also desired to develop new transistor configurations, and new assemblies (e.g., memory assemblies) utilizing the new transistor configurations.

BRIEF DESCRIPTION OF THE DRAWINGS

FIGS. 1A, 5A and 6A are diagrammatic top-down views of regions of the example integrated assembly at the process stages of FIGS. 1, 5 and 6, respectively. FIGS. 1, 5 and 6 are along the lines A-A of FIGS. 1A, 5A and 6A, respectively.

DETAILED DESCRIPTION OF THE ILLUSTRATED EMBODIMENTS

Some embodiments include methods of forming transistors in which template material (e.g., silicon) is replaced with metal (e.g., one or more of molybdenum (Mo), tungsten (W), tantalum (Ta), titanium (Ti), cobalt (Co) and nickel (Ni)) to form conductive gating structures of the transistors. The transistors may be incorporated into integrated memory, and the conductive gating structures may be incorporated into wordlines of such memory.

Some embodiments include transistors having molybdenum within conductive gating material. Some embodiments include integrated assemblies (e.g., integrated memory) comprising such transistors.

Example embodiments are described with reference to FIGS. 1-7.

Figure 1:
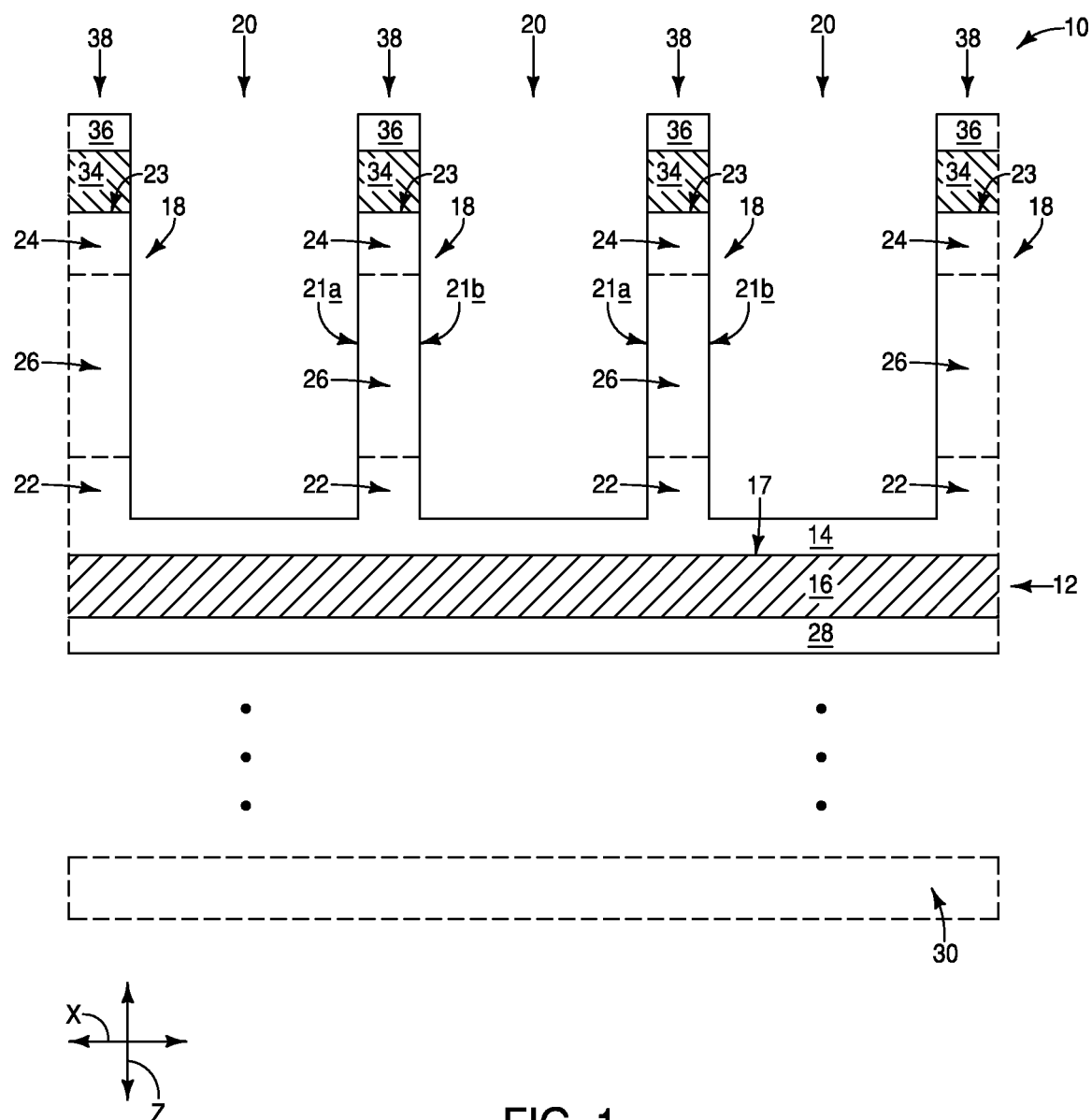
FIGS. 1-6 are diagrammatic cross-sectional side views of a region of an example integrated assembly at example sequential process stages of an example method.

Referring to FIG. 1, an integrated assembly (construction, architecture) 10 includes a conductive line 12, and includes semiconductor material 14 supported over the conductive line 12.

The conductive line 12 extends along an illustrated x-axis direction. The conductive line 12 comprises conductive material 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the conductive line 12 may correspond to a digit line (bitline, sense line, etc.).

The semiconductor material 14 is shown to be patterned into a plurality of pillars 18, with such pillars being spaced from one another along the x-axis direction. Gaps 20 are between the spaced-apart pillars 18. In the shown embodiment, regions of the semiconductor material 14 extend along an upper surface 17 of the conductive line 12 within the gaps 20. In other embodiments, such regions of the semiconductor material 14 may be omitted so that the upper surface 17 of the conductive line 12 is exposed within the gaps 20 at the process stage of FIG. 1.

Each of the pillars 18 comprises a pair of sidewalls surfaces 21a and 21b along the cross-section of FIG. 1, and comprises a top surface 23 extending between the sidewall surfaces 21a and 21b. In some embodiments, the sidewall surfaces 21a may be referred to as first sidewall surfaces, and the sidewall surfaces 21b may be referred to as second sidewall surfaces which are laterally disposed relative to the first sidewall surfaces.

The upper surface 17 of the conductive line 12 may be considered to be a horizontally-extending upper surface. The pillars 18 extend vertically along an illustrated z-axis direction, and accordingly extend orthogonally (or at least substantially orthogonally) relative to the horizontally-extending upper surface 17. The term "substantially orthogonally" means orthogonally to within reasonable tolerances of fabrication and measurement. In some embodiments, the pillars 18 may be considered to extend vertically, or at least substantially vertically. In some applications, the pillars 18 may extend at an angle of about 90° (i.e., 90°±10°) relative to the horizontally-extending surface 17.

The sidewalls 21a and 21b may be vertically straight (as shown) or may be tapered along the vertical direction.

The semiconductor material 14 may comprise any suitable composition(s); and in some embodiments may comprise, consist essentially of, or consist of one or more of silicon, germanium, III/V semiconductor material (e.g., gallium phosphide), semiconductor oxide (e.g., indium gallium zinc oxide), etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of silicon. The silicon may be in any suitable phase (e.g., amorphous, polycrystalline, monocrystalline, etc.).

In the shown embodiment, each of the pillars 18 includes a lower source/drain region 22, an upper source/drain region 24, and a channel region 26 vertically between the upper and lower source/drain regions. In some embodiments, the upper and lower source/drain regions 22 and 24 may be n-type regions. In applications in which the semiconductor material 14 comprises silicon, the upper and lower source/drain regions 22 and 24 may be conductively doped with suitable n-type dopant (e.g., phosphorus, arsenic, etc.). The channel regions 26 may be doped with appropriate dopant to achieve desired threshold-voltage levels.

Dashed lines are provided between the channel region 26 and the source/regions 22 and 24 to illustrate approximate boundaries between the channel region and the source/drain regions.

The lower source/drain regions 22 are electrically coupled with the conductive line 12, and in the shown embodiment are directly against such conductive line.

The conductive line 12 is shown to be over an insulative material 28, which in turn is supported by a base 30.

The insulative material 28 may comprise any suitable composition(s), including, for example, one or more of silicon dioxide, silicon nitride, hafnium oxide, aluminum oxide, zirconium oxide, etc.

The base 30 may comprise semiconductor material; and may, for example, comprise, consist essentially of, or consist of monocrystalline silicon. The base 30 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 30 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 30 and the insulative material 28 to indicate that additional structures and materials may be provided between the base 30 and the insulative material 28 in some embodiments.

In the illustrated embodiment, conductive material 34 is provided over the upper surfaces 23 of the pillars 18, and protective capping material 36 is provided over the conductive material 34.

The conductive material 34 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 34 may comprise metal (e.g., tungsten) over metal silicide (e.g., tungsten silicide).

The conductive material 34 may be referred to as conductive interconnect material, and is ultimately utilized for electrically coupling the upper source/drain regions 24 with additional structures (described below with reference to FIG. 6). In some embodiments, the conductive material 34 may be omitted.

The capping material 36 may comprise any suitable composition(s), and in some example embodiments may comprise, consist essentially of, or consist of silicon nitride.

Figure 1A:
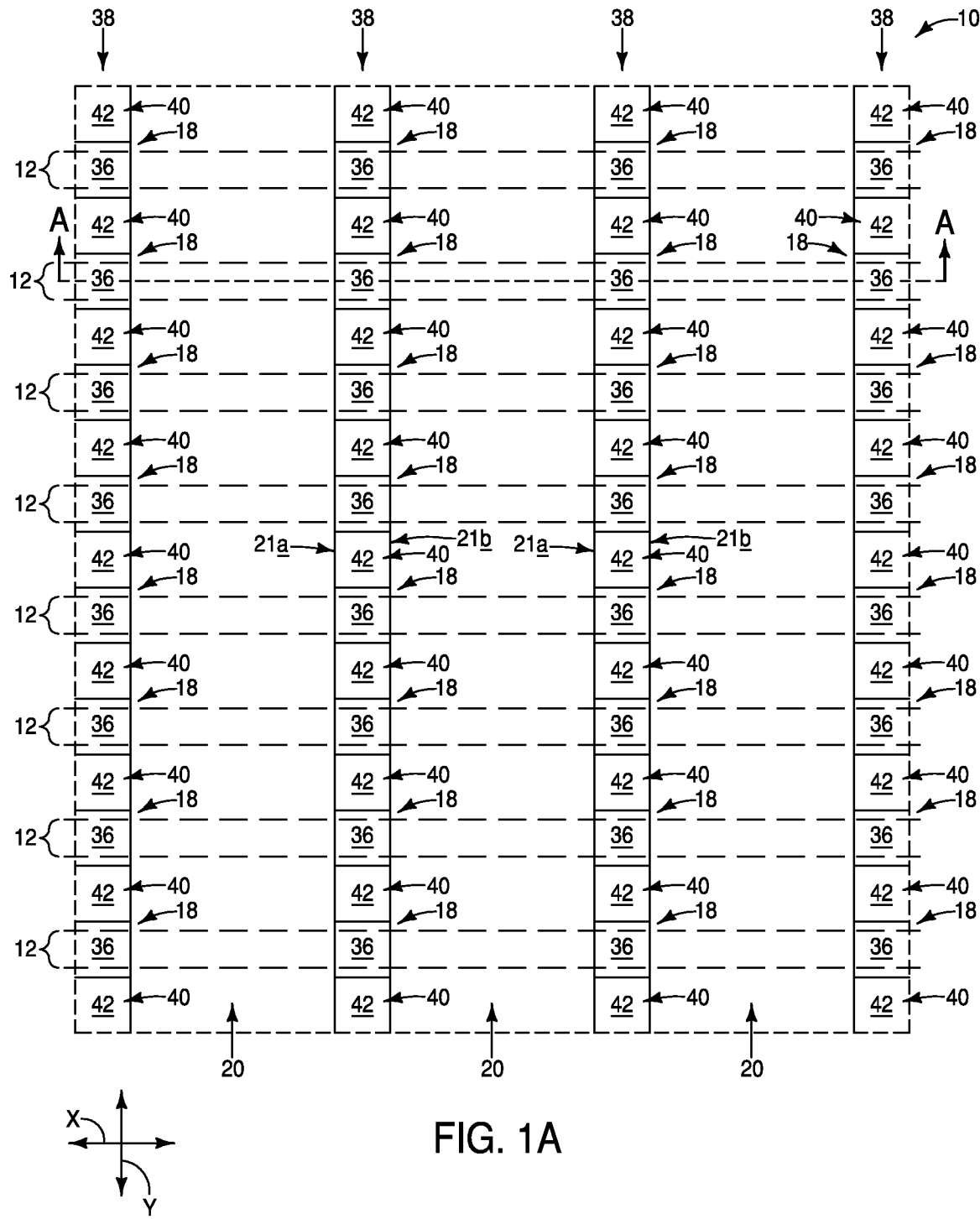

FIG. 1A shows a region of the assembly 10 in top-down view, and shows that the conductive line 12 of FIG. 1 is representative of multiple conductive lines which extend along the x-axis direction. The conductive lines 12 are diagrammatically indicated with dashed-line (phantom) view in FIG. 1A to indicate that they are beneath other structures.

Figure 5:
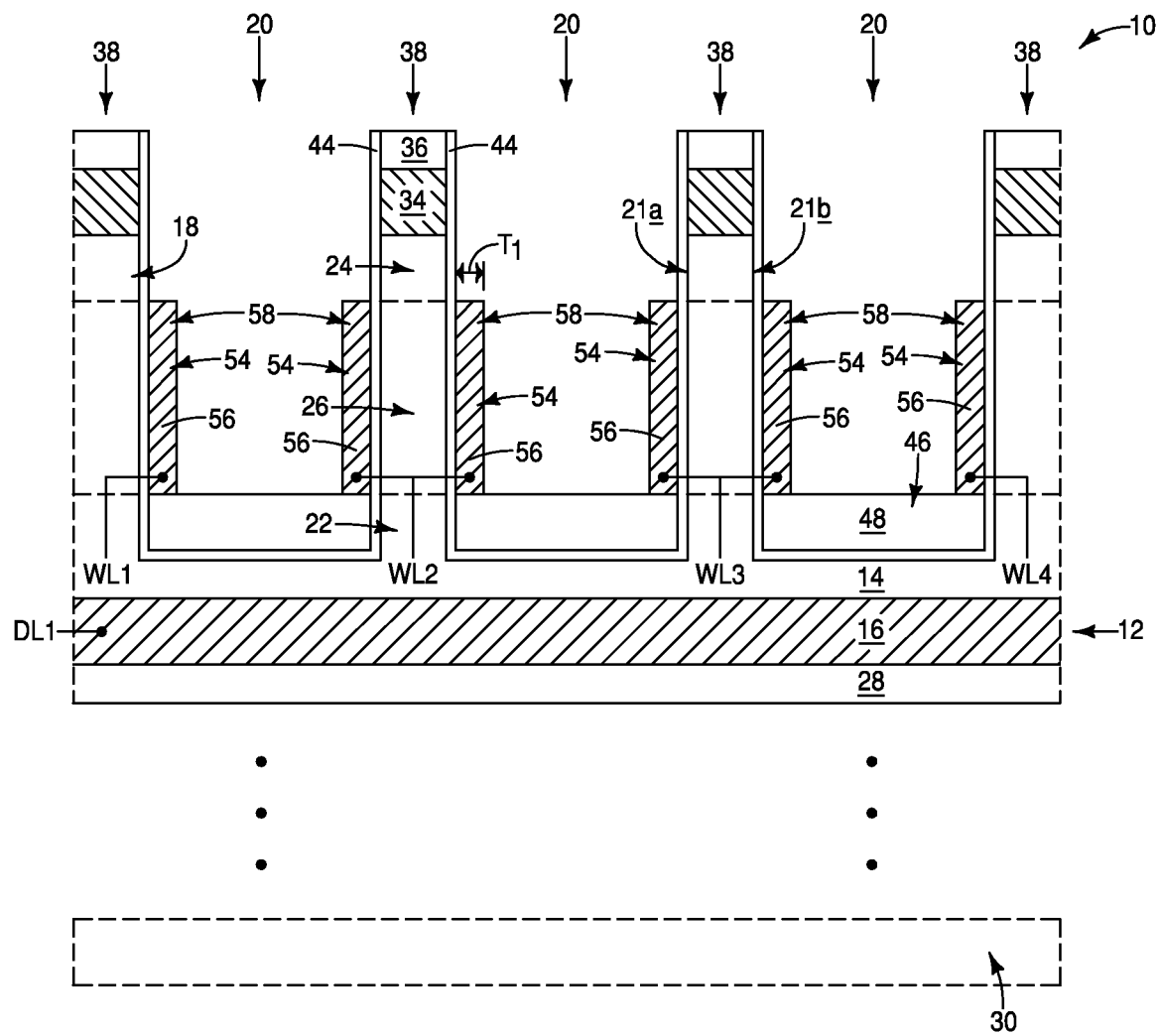

The conductive lines 12 may be referred to as first conductive lines, and may be considered together to correspond to a series of the first conductive lines. Such series may be referred to as a first series to distinguish it from another series of conductive lines described at a subsequent process stage (FIG. 5). In some embodiments, the conductive lines 12 may correspond to digit lines. In some embodiments, the conductive lines 12 may be referred to as linearly-extending conductive structures. Although the conductive lines 12 are shown to be straight, in other embodiments the conductive lines 12 may be curved, wavy, etc.

FIG. 1A shows the pillars 18 contained within linearly-extending structures 38. The structures 38 extend along an illustrated y-axis direction. In some embodiments, the x-axis direction may be referred to as a first direction, and the y-axis direction may be referred to as a second direction which intersects the first direction. Although the second direction is shown to be substantially orthogonal to the first direction (with the term "substantially orthogonal" meaning orthogonal to within reasonable tolerances of fabrication and measurement), in other embodiments the second direction may cross the first direction without being substantially orthogonal to the first direction.

The linearly-extending structures 38 include insulative blocks 40 alternating with the pillars 18 along the second direction (i.e., the y-axis direction). The blocks 40 comprise insulative material 42. The insulative material 42 may comprise any suitable composition(s), and in some embodiments may comprise, consist essentially of, or consist of one or more of silicon nitride, silicon oxide, aluminum oxide, etc. In some embodiments, each of the linearly-extending structures 38 may be considered to comprise a series of the pillars 18 and a series of the insulative blocks 40.

Each of the linearly-extending structures 38 has a pair of opposing sidewalls, with such opposing sidewalls corresponding to the sidewalls 21a and 21b described above with reference to FIG. 1.

FIG. 1A shows that the gaps 20 described above with reference to FIG. 1 may be understood to correspond to trenches. Such trenches are between the linearly-extending structures 38, and extend along the second direction (i.e., the y-axis direction).

Figure 2:
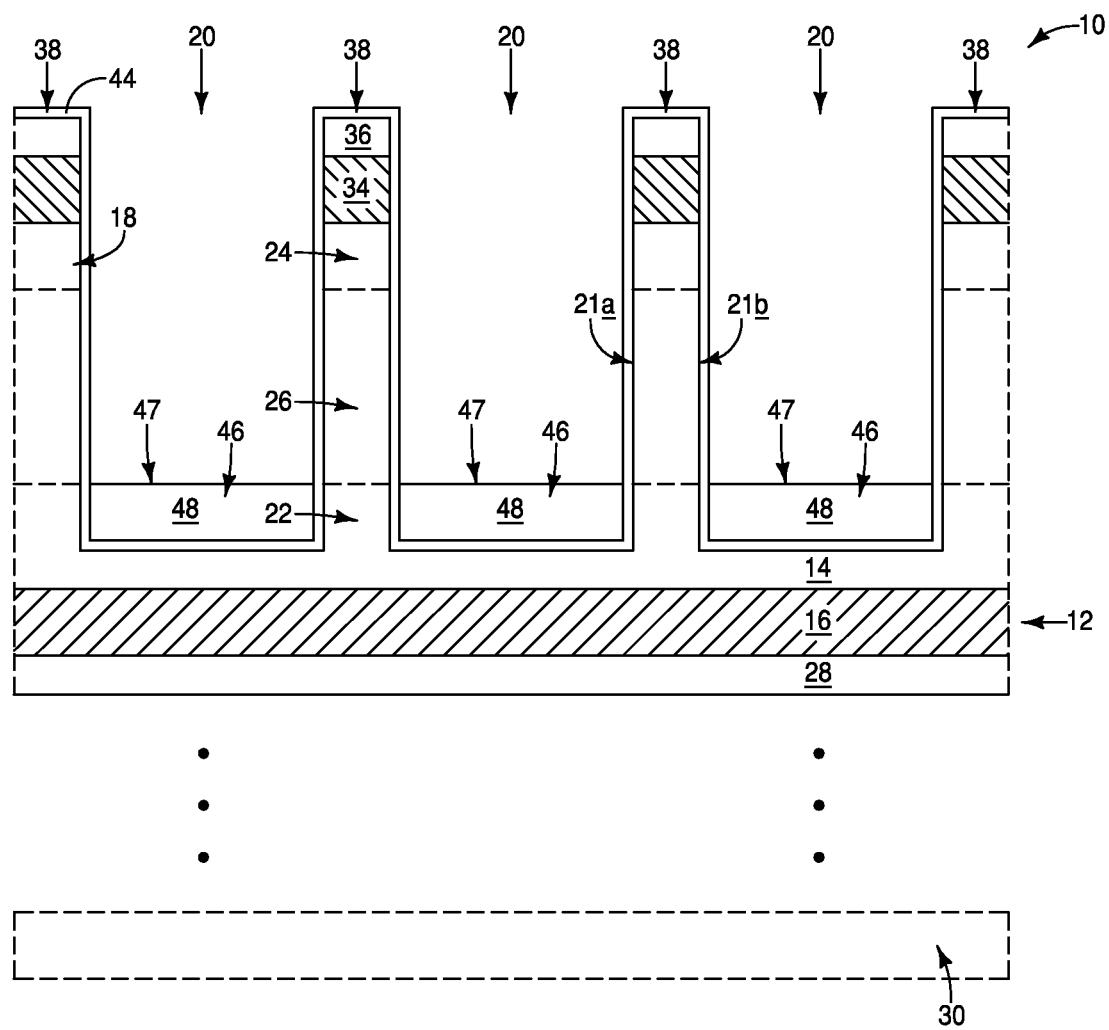

Referring to FIG. 2, insulative material 44 is formed along the sidewalls 21a and 21b of the pillars 18. In the illustrated embodiment, the insulative material 44 extends over the pillars 18, and within the gaps 20 between the pillars. In other embodiments, the insulative 44 may be formed to be only along the sidewalls 21a and 21b of the pillars 18, and in some embodiments may be formed only along sidewalls of the channel regions 26 of the pillars 18.

The insulative material 44 may comprise any suitable composition(s). In some embodiments, the insulative 44 may comprise, consist essentially of, or consist of silicon dioxide ($SiO_2$). In some embodiments, the insulative material 44 may include one or more high-k materials either in addition to the silicon dioxide, or alternatively to the silicon dioxide. The term "high-k" means a dielectric constant greater than that of silicon dioxide (i.e., greater than about 3.9). Example high-k dielectric materials include aluminum oxide, hafnium oxide, zirconium oxide, silicon nitride, etc.

In some embodiments, the insulative material 44 may be referred to as gate dielectric material.

Insulative steps 46 are formed within lower regions of the gaps (trenches) 20. In the shown embodiment, the steps 46 have upper surfaces 47 which are approximately coextensive with the boundary between the lower source/drain regions 22 and the channel regions 26. In other embodiments, the upper surfaces 47 of the steps 46 may be formed at other suitable levels. As will become clear from the discussion follows, the upper surfaces 47 of the steps 46 may be utilized to calibrate locations of wordlines (specifically, may define the locations for bottom surfaces of the wordlines).

The steps 46 comprise insulative material 48. The insulative material 48 may comprise any suitable composition(s), and in some embodiments may comprise, consist essentially of, or consist of silicon nitride. In some embodiments, the material 48 of the steps 46 may be the same composition as the insulative capping material 36, and in other embodiments the materials 36 and 48 may be different compositions relative to one another.

Figure 3:
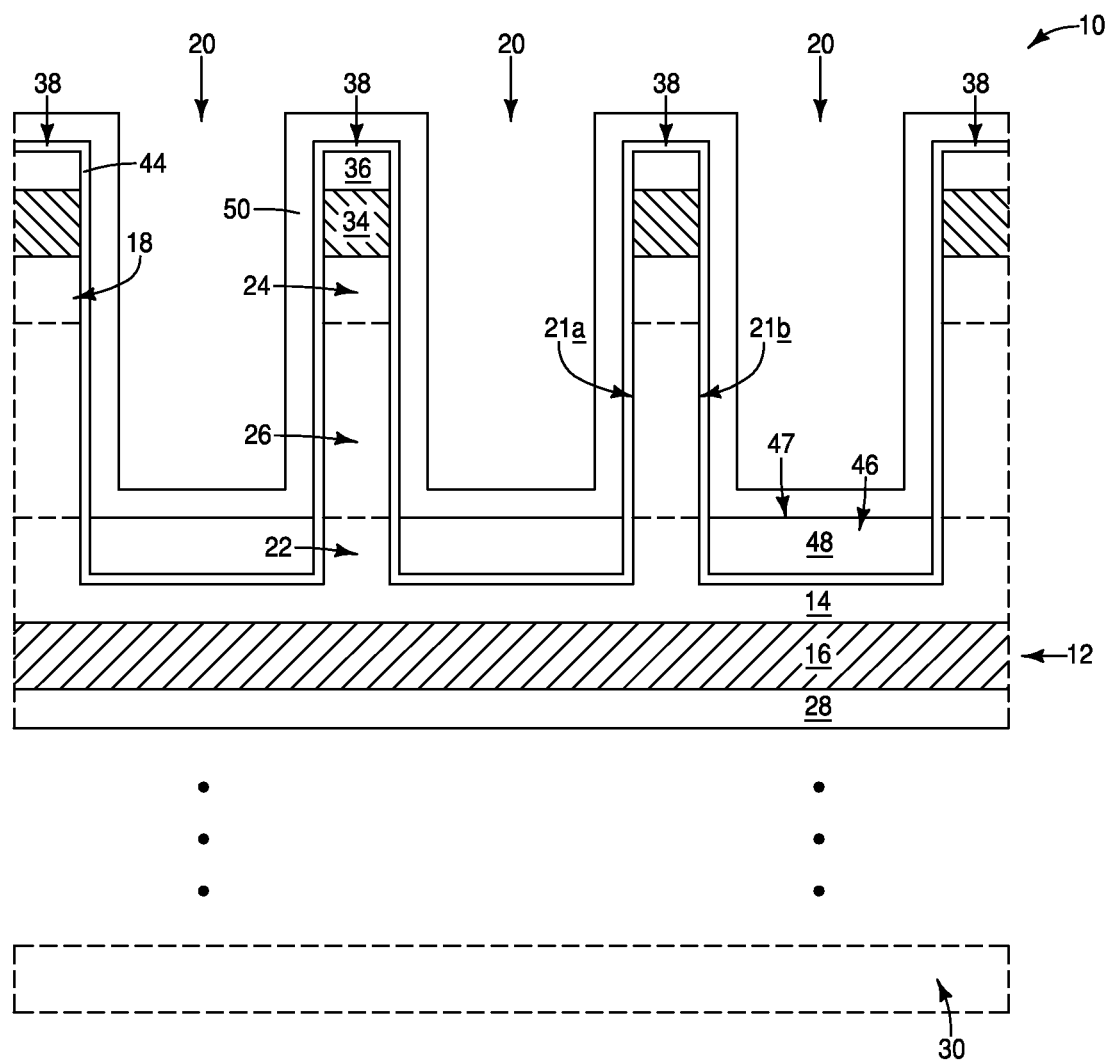

Referring to FIG. 3, a layer of template material 50 is formed over the linearly-extending structures 38 and within the trenches 20. The template material 50 within the trenches 20 extends across the upper surfaces 47 of the insulative steps 46.

The template material 50 may comprise any suitable composition(s), and in some embodiments may comprise, consist essentially of, or consist of silicon. The silicon may be in any suitable crystalline form (e.g., polycrystalline, amorphous, monocrystalline, etc.).

The template material 50 may be formed to any suitable thickness, and in some embodiments may be formed to a thickness within a range of from about 10 angstroms (Å) to about 100 Å.

Figure 4:
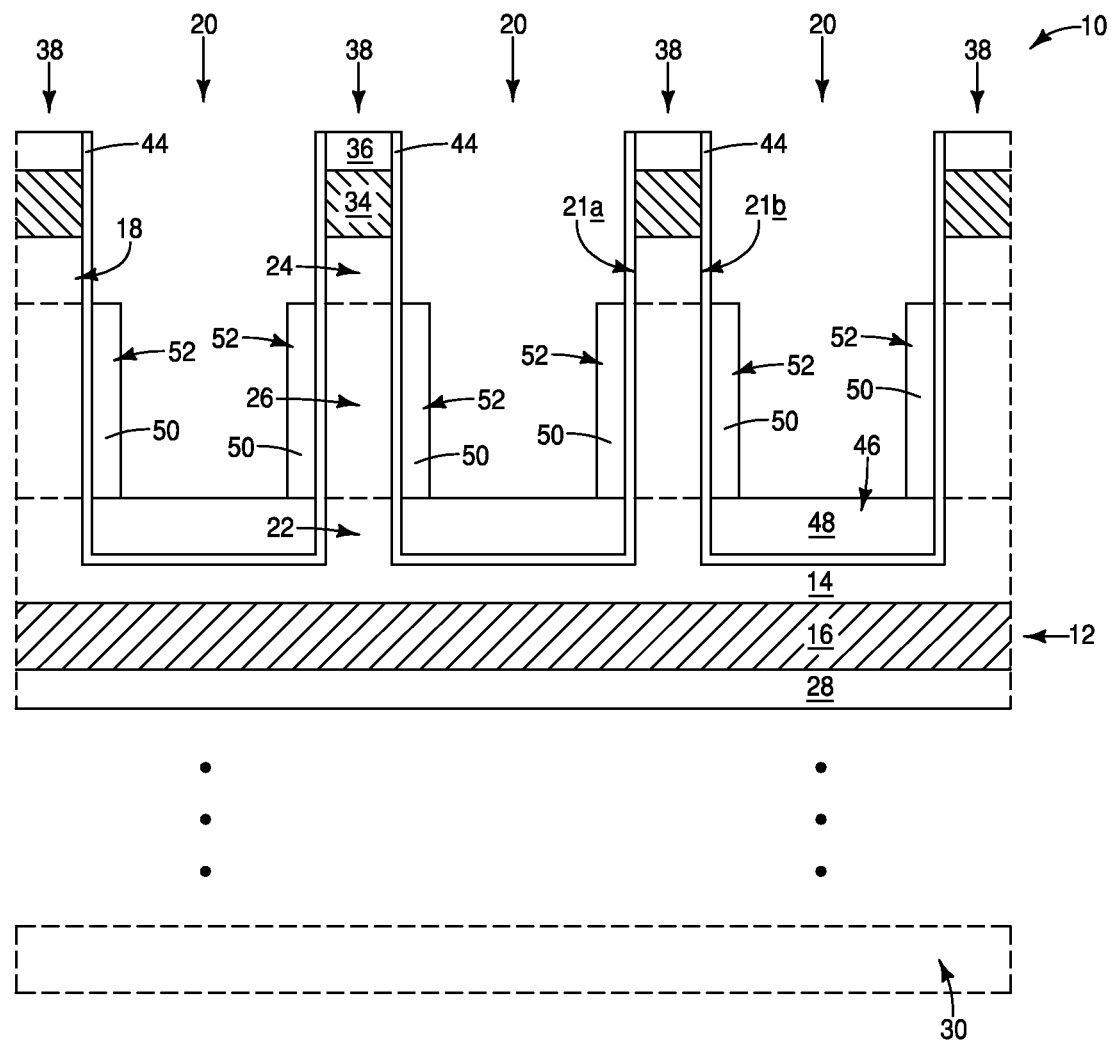

Referring to FIG. 4, the template material 50 is etched to remove the template material from over the capping material 36, and to remove portions of the template material from over the insulative steps 46. Remaining segments of the template material 50 are patterned into template structures 52. In the shown embodiment, the template structures 52 are aligned with the channel regions 26. The template structures 52 may be linear structures which extend along the sidewall surfaces 21a and 21b. The template structures 52 are supported by the insulative steps 46.

The etching of the template material 50 may utilize any suitable methodology. For instance, in some embodiments the etching may utilize a reactive ion etch (RIE), either with or without plasma. In some embodiments, the etching may utilize tetramethylammonium hydroxide (TMAH). The template material 50 may have a first thickness (an original thickness) prior to the etch and may have a second thickness after the etch. The second thickness may be the same as the first thickness, or may be less than the first thickness. In some embodiments, the second thickness may be within a range of from about 10% to about 100% of the first thickness.

Referring to FIG. 5, the template material 50 (FIG. 4) is replaced with metal-containing structures 54. Such replacement may comprise exposing the template material 50 to one or more metal-halide precursors (e.g., $MoF_6$) under conditions which include a temperature within a range of from about 100° C. to about 1000° C., and a pressure within a range of from about 1 mTorr (millitorr) to about atmospheric. The metal-containing precursor(s) consume the template material 50 and eventually replace the template structures 52 (FIG. 4) with the metal-containing structures 54. In some embodiments, the processing utilized to replace the template material structures 52 with the metal-containing structures 54 may utilize a relatively low temperature (e.g., a temperature of less than or equal to about 300° centigrade), which may advantageously be suitable for utilization with temperature-sensitive materials and components that may be present on a semiconductor die during the processing utilized to form the metal-containing structures 54.

An advantage of forming the metal-containing structures 54 from metal-halide precursor(s) is that such may advantageously avoid problematic carbon contamination of the metal-containing material analogous to problematic contamination that may occur in conventional processes in which metallo-organic precursors are utilized.

The structures 54 comprise metal-containing material 56. The metal-halide precursor(s) may include or more of molybdenum, tungsten, tantalum, titanium, cobalt and nickel. Accordingly, the metal-containing material 56 may comprise, consist essentially of, or consist of one or more of molybdenum (Mo), tungsten (W), tantalum (Ta), titanium (Ti), cobalt (Co) and nickel (Ni). In some example embodiments, the metal-containing material 56 may comprise, consist essentially of, or consist of molybdenum. An advantage of molybdenum is that such may have high conductivity, even when formed into extremely thin structures. In some embodiments, the metal-containing structures 54 may have lateral thicknesses $T_1$ within a range of from about 10 Å to about 100 Å.

Figure 5A:
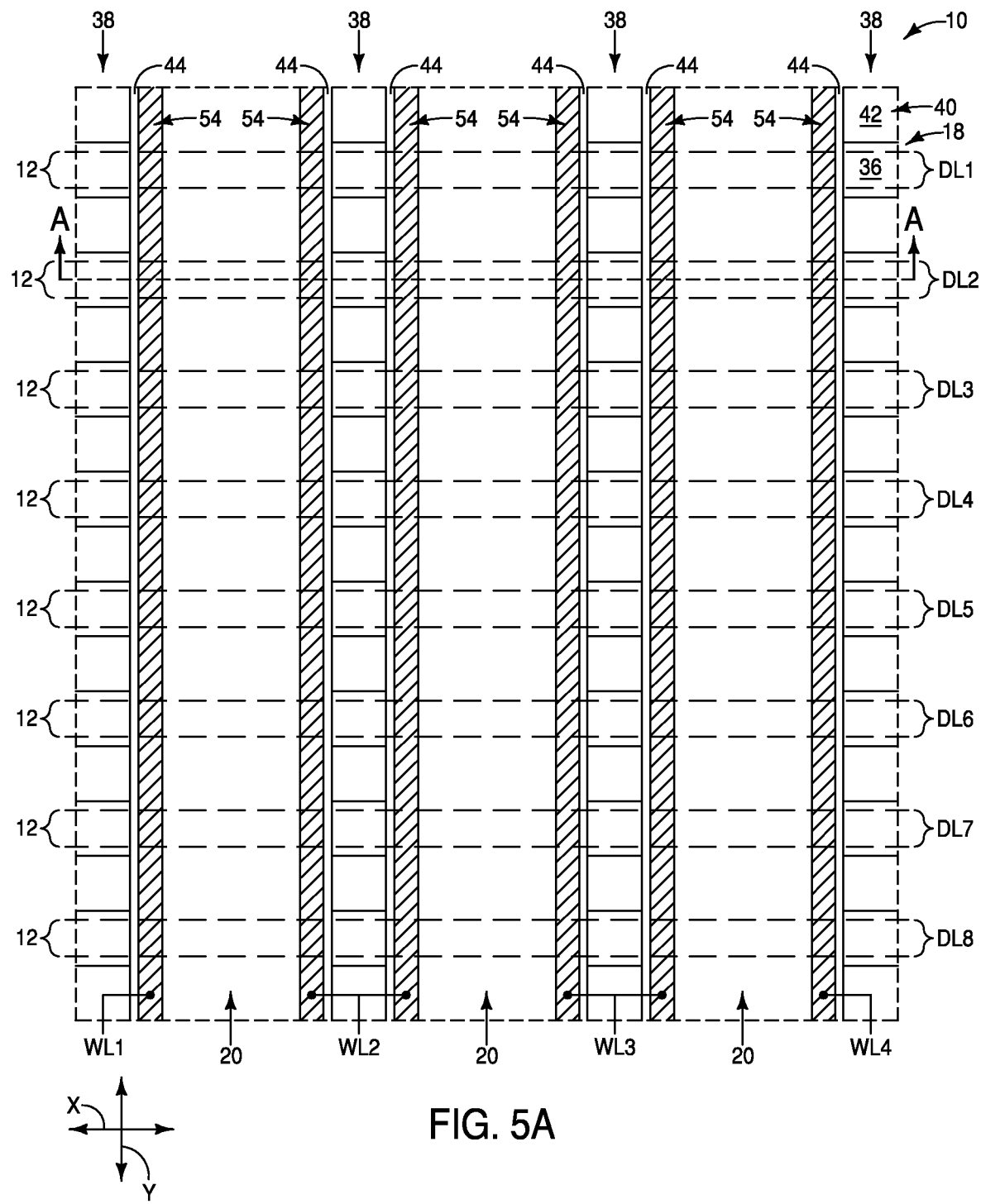

FIG. 5A is a top-down view of a region of the assembly 10 at the process stage of FIG. 5. The metal-containing structures 54 are configured as conductive lines which extend along the second direction (i.e., the y-axis direction). In some embodiments, the conductive lines 54 may be referred to as second conductive lines, and may be considered together to correspond to a series. Such series may be referred to as a second series to distinguish it from the first series of the first conductive lines 12. In some embodiments, the conductive lines 54 may correspond to wordlines. In some embodiments, the conductive lines 54 may be referred to as linearly-extending conductive structures. Although the conductive lines 54 are shown to be straight, in other embodiments the conductive lines 54 may be curved, wavy, etc.

Referring again to FIG. 5, the conductive lines 54 may be considered to include gating regions (gating structures) 58 proximate the channel regions 26 of the pillars 18. The gating regions 58 are spaced from (i.e., laterally offset from) the channel regions by at least the insulative material 44. In some embodiments, the gating regions 58 may be considered to be operatively proximate the channel regions 26. A gating region is "operatively proximate" a channel region of an access device when the gating region and the channel region are oriented such that a sufficient voltage applied to the gating region will induce an electric field which enables current flow through the channel region to electrically couple the source/drain regions (i.e., regions 22 and 24) on opposing sides of the channel region with one another. If the voltage to the gating region is below a threshold level, the current will not flow through the channel region, and the source/drain regions on opposing sides of the channel region will not be electrically coupled with one another. The selective control of the coupling/decoupling of the source/drain regions through the level of voltage applied to the gating region may be referred to as gated coupling of the source/drain regions.

The conductive lines 12 FIGS. 5 and 5A are labeled as digit lines DL1-DL8, and the conductive lines 54 of FIGS. 5 and 5A are labeled as wordlines WL1-WL4. In the illustrated embodiment, paired lines 54 are coupled with another to form the wordlines WL1-WL4. The digit lines DL1-DL8 extend along a first direction corresponding to an illustrated x-axis direction, and the wordlines WL1-WL4 extend along a second direction corresponding to an illustrated y-axis direction. The second direction of the wordlines crosses the first direction of the digit lines. In the shown embodiment, the second direction of the wordlines is orthogonal to (or at least substantially orthogonal to) the first direction of the digit lines, with the term "substantially orthogonal" meaning orthogonal to within reasonable tolerances of fabrication and measurement. In other embodiments, the wordlines may cross the digit lines at other angles.

Figure 6:
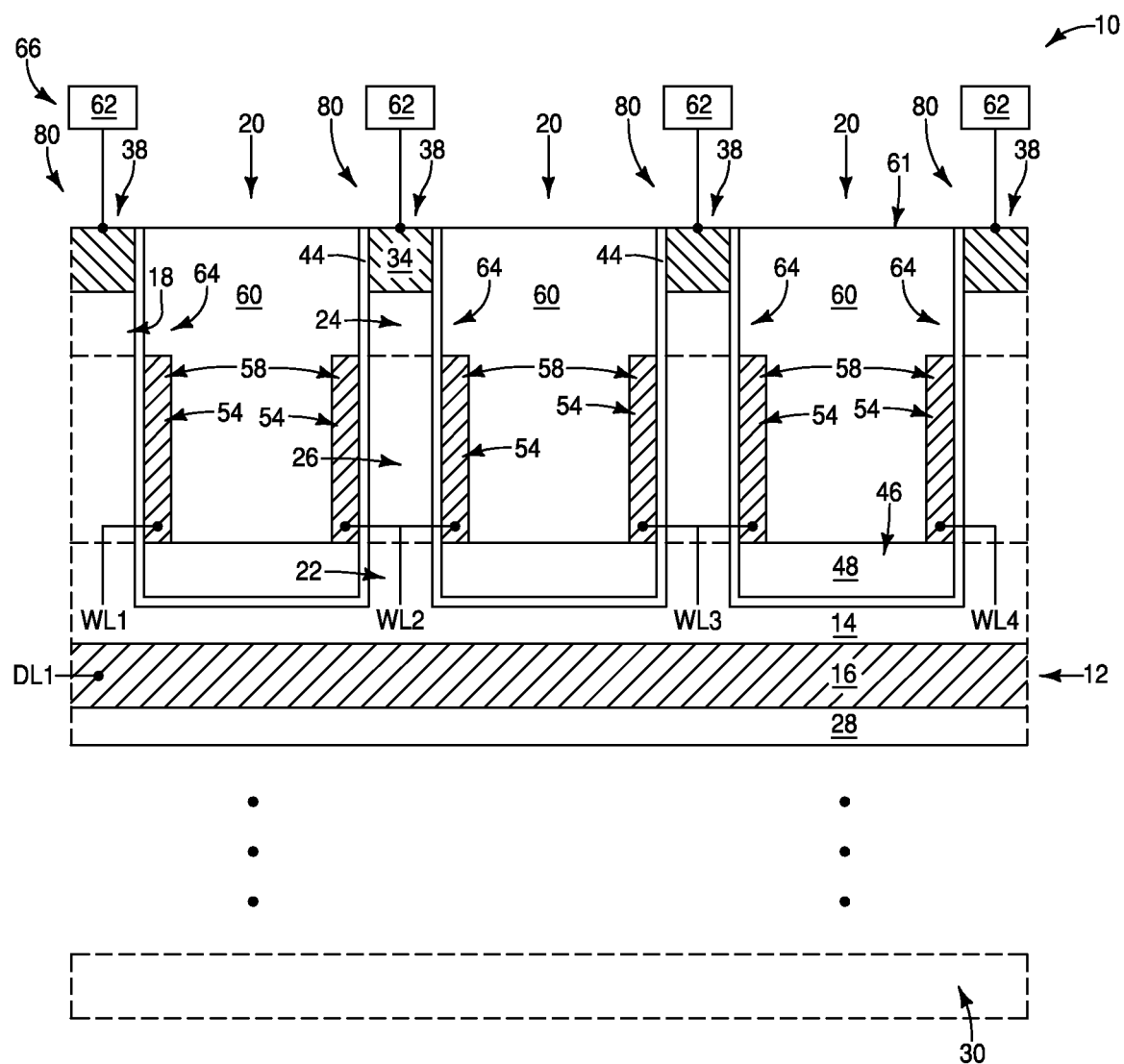

Referring to FIGS. 6 and 6A, insulative material 60 is formed within the trenches 20 and over the conductive lines 54. The insulative material 60 may comprise any suitable composition(s), and in some embodiments may comprise, consist essentially of, or consist of silicon dioxide.

A planarized surface 61 is formed to extend across the materials 34, 44 and 60. In the shown embodiment, the formation of the planarized surface 61 removes the capping material 36 (FIG. 5).

The planarized surface 61 may be formed with any suitable processing, including, for example, chemical-mechanical polishing (CMP).

The conductive lines 12 and 54 are diagrammatically indicated in FIG. 6A with dashed-line (phantom) view to indicate that they are beneath other structures.

Storage elements 62 are electrically coupled with the upper source/drain regions 24. The storage elements 62 may be any suitable devices having at least two detectable states; and in some embodiments may be, for example, capacitors, resistive-memory devices, conductive-bridging devices, phase-change-memory (PCM) devices, programmable metallization cells (PMCs), etc. If the storage elements are capacitors, they may be either ferroelectric capacitors (i.e., may comprise ferroelectric insulative material between a pair of capacitor electrodes) or may be non-ferroelectric capacitors (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

The pillars 18 may be considered to be active regions of transistors (access devices) 64, with such transistors also including the gating regions 58 operatively proximate the channel regions 26. The storage elements 62 and transistors 64 may be incorporated into a memory array 66.

Figure 7:
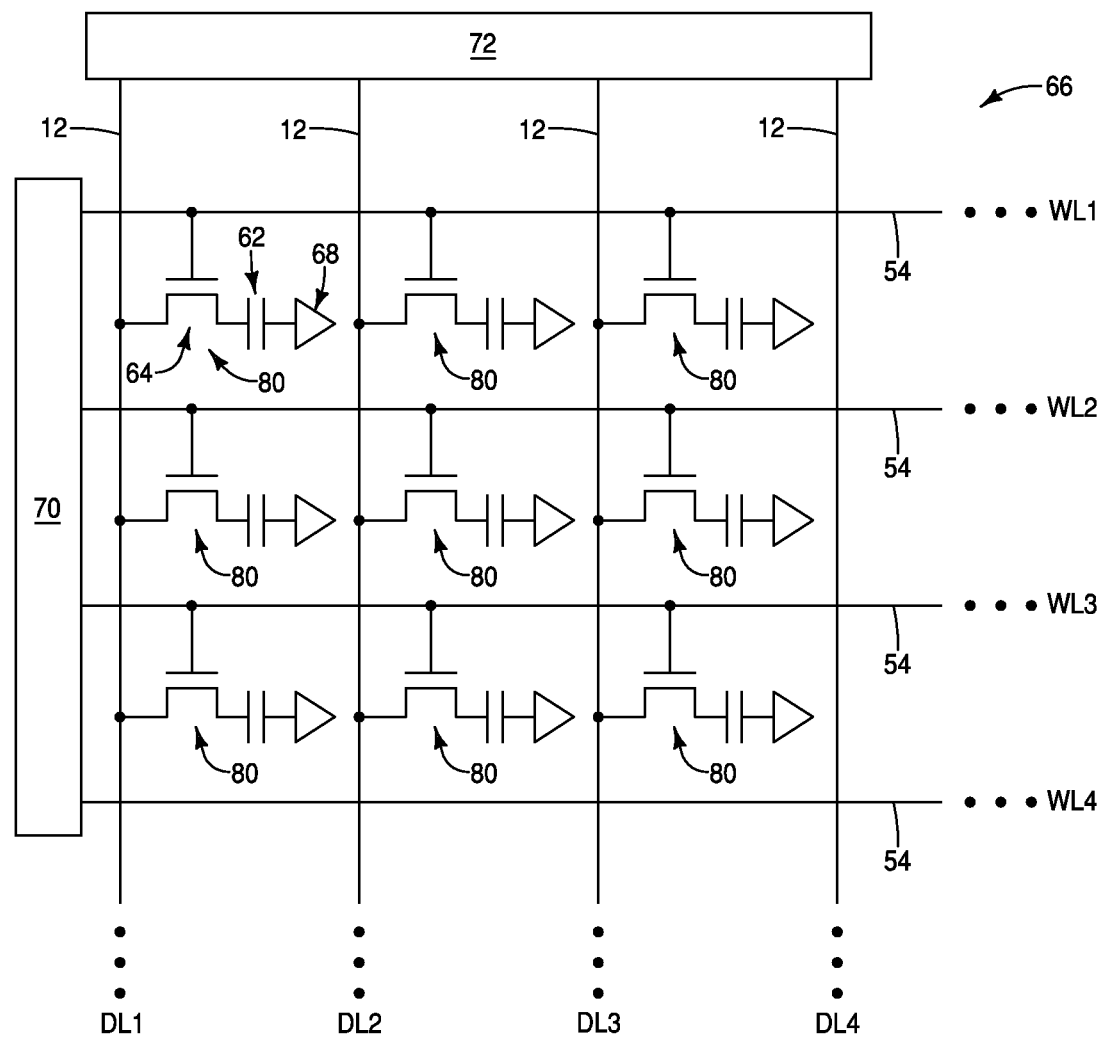
FIG. 7 is a diagrammatic schematic view of a region of an example memory array.

The memory array 66 may have any suitable configuration. FIG. 7 shows an example configuration in which the storage elements 62 are capacitors. The capacitors may be non-ferroelectric capacitors, and accordingly the memory array 66 may be a dynamic random access memory (DRAM) array. Alternatively, the capacitors may be ferroelectric capacitors, and accordingly the memory array 66 may be a ferroelectric random access memory (FeRAM) array.

The illustrated capacitors 62 have an electrical node coupled with an access transistor 64, and have another electrical node coupled with a reference 68. The reference 68 may correspond to any suitable reference voltage, including, ground, VCC/2, etc.

The wordlines 54 are shown coupled with wordline-driver-circuitry 70, and the digit lines 12 are shown coupled with sense-amplifier-circuitry 72. The access transistors 64 and storage elements 62 together form memory cells 80, with each of the memory cells being uniquely addressed by one of the digit lines 12 in combination with one of the wordlines 54. Example memory cells 80 are also labeled in FIG. 6 to assist the reader in understanding that the example memory cells 80 may include the illustrated transistors 64 together with the illustrated storage elements 62.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated transistor having an active region comprising semiconductor material. The active region includes a first source/drain region, a second source/drain region and a channel region between the first and second source/drain regions. A conductive gating structure is operatively proximate the channel region and comprises molybdenum.

Some embodiments include an integrated assembly having a first series of first conductive lines. The first conductive lines extend along a first direction. Pillars of semiconductor material extend upwardly from the first conductive lines. Each of the pillars includes a lower source/drain region, an upper source/drain region and a channel region between the upper and lower source/drain regions. The pillars have sidewalls. The lower source/drain regions are coupled with the first conductive lines. Insulative material is along the sidewalls. A second series of second conductive lines extends along a second direction which crosses the first direction. The second conductive lines include gating regions operatively proximate the channel regions. The gating regions are laterally offset from the channel regions by at least the insulative material. The second conductive lines comprise molybdenum. Storage elements are coupled with the upper source/drain regions.

Some embodiments include a method of forming an integrated assembly. A construction is formed to include a first series of first conductive lines, and to include pillars of semiconductor material extending upwardly from the first conductive lines. The first conductive lines extend along a first direction. Each of the pillars includes a lower source/drain region, an upper source/drain region and a channel region between the upper and lower source/drain regions. The pillars have sidewalls. The lower source/drain regions are coupled with the first conductive lines. Upper surfaces of the pillars are protected with a capping material. The pillars are arranged along linearly-extending structures. The linearly-extending structures extend along a second direction which crosses the first direction. Each of the linearly-extending structures includes a series of the pillars and a series of insulative blocks, with the insulative blocks alternating with the pillars along the second direction. Each of the linearly-extending structures has a pair of opposing sidewalls along a cross-section. Insulative material is formed along the sidewalls. Trenches are between adjacent of the linearly-extending structures and extend along the second direction. Insulative steps are formed within lower regions of the trenches. Template structures are formed adjacent the insulative material and are supported by the insulative steps. The template structures extend along the sidewalls of the linearly-extending structures. The template structures comprise template material. One or more metal-halide precursor materials are utilized to consume the template material and to thereby replace the template structures with metal-containing structures. The metal-containing structures are configured as a second series of second conductive lines. The second conductive lines extend along the second direction. The second conductive lines include gating regions operatively proximate the channel regions, with said gating regions being laterally offset from the channel regions by at least the insulative material. The capping material is removed, and storage elements are formed to be coupled with the upper source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
    forming a construction which includes a first series of first conductive lines, and which includes pillars of semiconductor material extending upwardly from the first conductive lines; the first conductive lines extending along a first direction; each of the pillars including a lower source/drain region, an upper source/drain region and a channel region between the upper and lower source/drain regions; the pillars having sidewalls; the lower source/drain regions being coupled with the first conductive lines; upper surfaces of the pillars being protected with a capping material; the pillars being arranged along linearly-extending structures; the linearly-extending structures extending along a second direction which crosses the first direction; each of the linearly-extending structures including a series of the pillars and a series of insulative blocks, with the insulative blocks alternating with the pillars along the second direction; each of the linearly-extending structures having a pair of opposing sidewalls along a cross-section; trenches being between adjacent of the linearly-extending structures and extending along the second direction;
    forming insulative material along the sidewalls;
    forming insulative steps within lower regions of the trenches;
    forming template structures adjacent the insulative material and supported by the insulative steps; the template structures extending along the sidewalls of the linearly-extending structures; the template structures comprising template material;
    utilizing one or more metal-halide precursor materials to consume the template material and thereby replace the template structures with metal-containing structures; the metal-containing structures being configured as a second series of second conductive lines; the second conductive lines extending along the second direction; the second conductive lines including gating regions operatively proximate the channel regions, with said gating regions being laterally offset from the channel regions by at least the insulative material; and
    removing the capping material and forming storage elements coupled with the upper source/drain regions.

2. The method of claim 1 wherein the metal-containing structures include one or more of Mo, W, Ta, Ti, Co and Ni.

3. The method of claim 1 wherein the template material comprises silicon.

4. The method of claim 1 wherein the template material consists of silicon.

5. The method of claim 4 wherein said one or more metal-halide precursor materials include $MoF_6$; and wherein the metal-containing structures include molybdenum.

6. The method of claim 1 wherein the insulative steps comprise a same composition as the capping material.

7. The method of claim 6 wherein said same composition comprises silicon nitride.

8. The method of claim 1 further comprising:
    forming the template material as a layer which extends along the opposing sidewalls of the linearly-extending structures, over the capping material and across the insulative steps; and etching said layer of the template material to remove the template material from over the capping material and to remove portions of the template material from over the insulative steps, and to thereby pattern the template structures from the layer of the template material.

9. The method of claim 8 wherein the etching utilizes a reactive ion etch.

10. The method of claim 8 wherein the layer of the template material has a first thickness prior to the etching of said layer of the template material, and wherein the template structures have a second thickness which is less than the first thickness.

11. The method of claim 1 further comprising:
coupling the first conductive lines with sense-amplifier-circuitry; and
coupling the second conductive lines with wordline-driver-circuitry.

12. A method of forming an integrated transistor, comprising:
forming an active region comprising a semiconductor material structure having a vertically-extending pillar portion and opposing horizontally-extending sections that extend outwardly from a lower region of the pillar portion; the pillar portion including a first source/drain region, a second source/drain region and a channel region between the first and second source/drain regions;
forming an insulative material along sidewalls of the pillar portion and over the opposing sections; and
forming a conductive gating structure operatively proximate the channel region and comprising molybdenum, the conductive gating structure being spaced from the pillar portion and the opposing sections of the semiconductor material structure by the insulative material.

13. The method of claim 12 wherein the conductive gating structure consists of the molybdenum.

14. The method of claim 12 wherein the conductive gating structure comprises one or more of W, Ta, Ti, Co and Ni in addition to the molybdenum.

15. The method of claim 12 wherein the second source/drain region is vertically offset relative to the first source/drain region.

16. The method of claim 12 wherein the semiconductor material comprises silicon.

17. The method of claim 12 wherein the semiconductor material comprises germanium.

18. The method of claim 12 wherein the semiconductor material comprises semiconductor oxide.

19. The method of claim 12 wherein the insulative material comprises $SiO_2$.

20. The method of claim 12 wherein the insulative material comprises one or more high-k compositions.

* * * * *